United States Patent [19]

Takahaski et al.

[11] Patent Number: 5,441,011

[45] Date of Patent: Aug. 15, 1995

[54] SUBLIMATION GROWTH OF SINGLE CRYSTAL SIC

[75] Inventors: Jun Takahaski; Masatoshi Kanaya, both of Sagamihara, Japan

[73] Assignee: Nippon Steel Corporation, Tokyo, Japan

[21] Appl. No.: 213,055

[22] Filed: Mar. 15, 1994

[30] Foreign Application Priority Data

Mar. 16, 1993 [JP] Japan .................. 5-055687

[51] Int. Cl.6 .................. C30B 23/00; H01L 21/20
[52] U.S. Cl. .................. 117/84; 117/105; 117/951; 437/100; 148/DIG. 148
[58] Field of Search .................. 117/84, 88, 89, 951, 117/105; 437/100; 148/DIG. 148

[56] References Cited

U.S. PATENT DOCUMENTS

| 2,854,364 | 9/1958 | Lely . | |
|---|---|---|---|
| 3,147,159 | 9/1964 | Lowe | 437/100 |
| 3,236,780 | 2/1966 | Ozarow | 117/951 |
| 3,343,920 | 9/1967 | Lowe | 117/951 |
| 3,615,930 | 10/1971 | Knippenber et al. | 17/951 |
| 4,147,572 | 4/1979 | Vodakov et al. | 117/951 |
| 4,866,005 | 9/1989 | Davis et al. . | |
| 5,211,801 | 5/1993 | Stein | 117/951 |

FOREIGN PATENT DOCUMENTS

| 63-57400 | 11/1988 | Japan . | |
|---|---|---|---|
| WO89/04055 | 5/1989 | WIPO | 437/100 |

Primary Examiner—Mary Wilczewski
Attorney, Agent, or Firm—Pollock, Vande Sande & Priddy

[57] ABSTRACT

A method of growing a first SiC single crystal on a seed crystal including a second SiC single crystal, comprises the steps of setting a SiC source material at an initial temperature, growing the first SiC single crystal on the seed crystal including the second SiC single crystal at a temperature lower than the initial temperature of the source material and gradually decreasing the source material temperature from the initial temperature during at least a predetermined period during the growing step.

7 Claims, 2 Drawing Sheets

SUBLIMATION GROWTH OF SINGLE CRYSTAL SIC

BACKGROUND OF THE INVENTION

1. Field of the Invention

This invention relates to a method of growing single crystals of high quality silicon carbide (SIC) for use as a substrate wafer for producing blue light emitting diodes, electronic devices or the like, and more particularly to a method of growing single crystals of SiC by a sublimation recrystallization process on a seed crystal of a SiC single crystal.

2. Description of the Related Art

A SiC single crystal, being a material chemically stable and resistant to high temperatures and radiant rays, holds high hopes for application in environment-resistant semiconductor devices. Having a wide bandgap, SiC single crystals are currently being used as material for short-wavelength light emitting diodes. In fact, 6H-SiC has a bandgap of about 3.0 eV at room temperature, and is used as the material for blue light emitting diodes. For this reason, there has been a keenly felt need for better quality SiC single crystal ingots for the manufacture of high quality wafers to be used for applications mentioned above.

As a production process of SiC single crystals by sublimation recrystallization, the process disclosed in JP-B-63-57400 (by Siemens Actiengesellshaft, Federal Republic of Germany) has been known, in which process the crystal growth is carried out at a fixed temperature. According to this production method, however, there are high possibilities of an occurrence of black linear defects extending from the seed crystal and an interminglement of polytypes other than the desired 6H polytype, and a decrease of crystal quality was witnessed in the later stage of the crystal growth when the source material is running short.

It is disclosed in U.S. Pat. No. 4,866,005 and WO-A-89/04055 (Davis et al.) that the source material temperature is fixed or is increased as the source material decreases. This is aimed to obtain a large SiC crystal by having the low-temperature portion of the source material sublimate and thereby allowing the crystal to grow for a long time after the high-temperature portion of the source material runs short.

SUMMARY OF THE INVENTION

The object of the present invention is to grow good-quality SiC single crystal ingots with low levels of crystal defects and with a fewer or without polytypes mixed in.

In order to achieve the above object, according to the present invention, there is provided a method of growing SiC single crystals including the steps of maintaining a SiC source powder at a first temperature, and growing a SiC single crystal on a seed crystal including a SiC single crystal at a temperature lower than the temperature of the SiC source powder which is gradually decreased from the first temperature with passage of time.

In the process of growing a SiC single crystal, the temperature of the SiC source powder may be decreased at a rate of 1° C. to 15° C. per hour.

Furthermore, in the process of growing a SiC single crystal, the temperature of the SiC source powder may be decreased at a rate of 5° C. to 10° C. per hour.

Generally, in the crystal growth, the quality of a grown crystal is considered to be better at a lower growth rate. When the source material temperature in the sublimation recrystallization method is decreased as time passes, the amount of vaporized SiC source material produced decreases. In addition, the amount of vaporized source material (which means a flux including $SiC_2$, $Si_2C$, and Si) reaching the grown crystal decreases, and the growth rate decreases, too. In this way, a high-quality single crystal is considered to be grown with low levels of crystal defects without polytypes mixed in.

In the crystal growth of SiC according to the sublimation method, however, since the lid of a crucible in which a seed crystal is mounted is constantly heated to a temperature higher than 2200° C., crystal defects included in the seed crystal progressively extend as black linear defects into the already grown region of the crystal. This defect elongates in the growing direction of the crystal with passage of heating time. Therefore, in the early stage of growth, the silicon carbide source material is raised to a relatively high temperature to promote the generation of the source material gas in large quantities at a far greater growth rate than the speed of enlargement of the linear defect mentioned above. Thereafter, a good-quality crystal portion from which a desired wafer is made is grown at lower speed. In this crystal growth technique, the portion of the crystal which was grown at high speed in the first half period of the crystal growth plays a role of a buffer layer which confines the defect where it is, so that the crystal grown in the latter half period has a better quality than the seed crystal used. Furthermore, according to this method, impurities and nitrogen which becomes a doner, or the like contained in the source material and the crucible, vaporize in the early stage of growth by high temperature, and they are trapped in the early-stage-growing portion of the crystal or discharged from the system. Consequently, in the middle and the latter stages when silicon carbide is grown at lower temperature, the crystal has better quality because the crystal has already been deprived of the impurities in the source material and the residual nitrogen.

In this crystal growth technique, if the source material temperature is decreased very quickly, this has adverse effects on the grown crystal. Therefore, it is adequate to gradually decrease the source material temperature as the growth time passes. As for a pattern of source material temperature decrease, the temperature decrease rate need not be fixed unless sharp changes are not involved.

The crystal grown by the crystal growth technique as mentioned above is obviously superior in transparency particularly in the latter stage of growth than the crystal grown at a constant source material temperature. The cause is considered to be related to the ratio between C and Si in the source material gas. According to a temperature-pressure diagram of SiC+C system shown on page 279 of IEEE Trsns. Electron Devices ED-30 (1983) 277, it is considered that in the early stage of growth the source material gas has an excessive content of Si, but the content of C as the material of a graphite crucible becomes excessive with passage of time. If the material temperature is decreased as mentioned above, the C gas pressure is prevented from becoming excessive, so that pressures of C and Si gases move in the direction of coming closer to each other. This is probably the reason why the decrease in the crystal quality in the latter stage of growth is suppressed.

DESCRIPTION OF THE PREFERRED EMBODIMENTS

Preferred embodiments of the present invention will be explained in detail with reference to the accompanying drawings.

Figure 1:
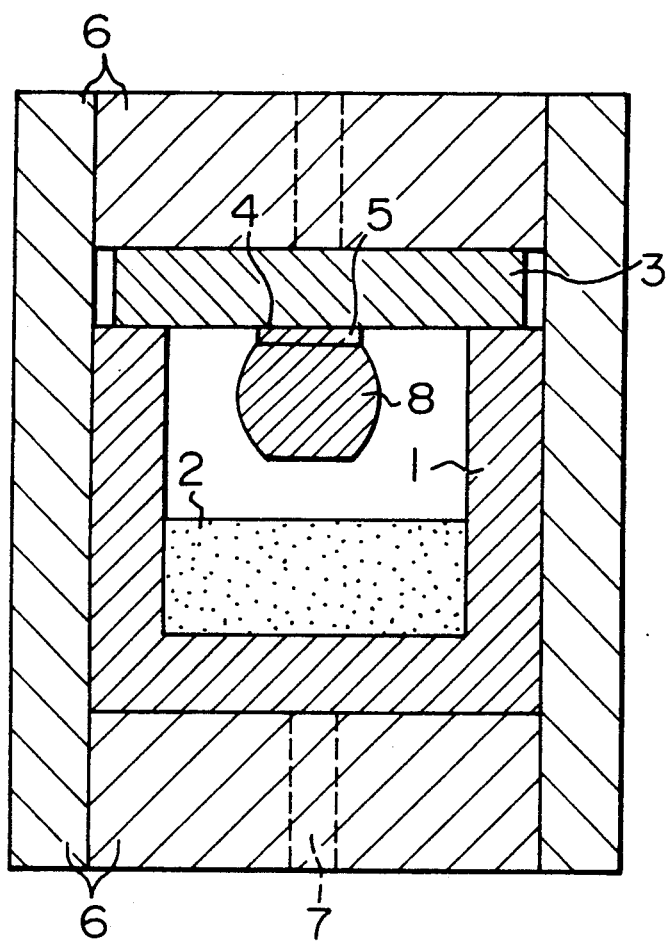
FIG. 1 is a sectional view schematically showing the construction of an example of a SiC single crystal growth apparatus.

FIG. 1 shows an example of a single crystal growth apparatus used in a method of growing a SiC single crystal according to the present invention. As shown in FIG. 1, a graphite crucible used in the single crystal growth apparatus comprises a closed-end crucible 1, and a crucible lid 3 made of graphite for covering the opening of the crucible 1 having a mounting portion for holding a SiC substrate seed crystal 5. The crucible 1 and the crucible lid 3 are covered on their side faces and top and bottom faces with a heat insulating material 6 made of a graphite felt, and are housed in a vessel capable of evacuation to a vacuum by an evacuation system and capable of pressure control of the internal atmosphere by using an inert gas, such as argon. Heating is done, for example, by a high frequency induction coil wound around the vessel. The crucible temperature is measured, for example, by a two-color pyrometer which receives light from the bottom portion of the crucible through an optical path 7 with a diameter of 2 to 4 mm provided at the center of the graphite felt covering the bottom portion of the crucible. The temperature thus measured is regarded as the source material temperature. The temperature of the crucible lid is measured through a similar optical path provided in the same felt as that of the top portion, and the measured temperature is regarded as the seed crystal temperature.

To give an example, crystal growth as described below is performed.

The vessel is evacuated, and the source material temperature is raised to about 2000° C. Thereafter, while introducing an inert gas into the vessel, the interior pressure is kept at about 600 Torr, and the source material temperature is raised to a target temperature. The SiC crystal growth should desirably be started by reducing the pressure by spending 10 to 90 min, and setting the atmospheric pressure at 2 to 50 Torr, more preferably, 10 to 20 Torr and the source material temperature at 2200° to 2500° C., more preferably, 2300° to 2400° C. At low temperatures below 2200° C., it is difficult for the source material to sublime, and at high temperatures over 2500° C., it becomes difficult for a better quality single crystal to be formed owing to thermal etching at the crystal surface, for example. The source material temperature should preferably be reduced at a rate of 1° C. to 15° C. per hour or more preferably at a rate of 5° C. to 10° C. per hour. Note that in the early stage of growth, in order to form a buffer layer at a high growth rate, it is preferable to grow a crystal for some time at a lower temperature decrease rate or at a fixed temperature. Too fast a decrease rate of the source material temperature is not adequate because the sublimation of the source material stops in a short time, but if this decrease rate is too low, it cannot be expected that the effect of the present invention is achieved. If the decrease rate is higher than 15° C. per hour, a sufficient growth time cannot be secured in a desired range of growth rate, a large single crystal cannot be formed. If the decrease rate is lower than 1° C. per hour, a deterioration of crystal quality is witnessed. In addition, when productivity is taken into consideration, the most desirable decrease rate is 5° C. to 10° C. per hour.

On the other hand, it is desirable to set the seed crystal temperature 30° C. to 120° C., more preferably, 50° C. to 80° C. lower than the source material temperature, and set the thermal gradient at 5° to 25° C./cm, more preferably, 10° to 20° C./cm. Furthermore, it is preferable to set a fixed seed crystal temperature, or decrease the seed crystal temperature at a rate lower than that of the source material temperature. Therefore, preferably, the thermal gradient is decreased gradually.

With regard to the relation between temperature and pressure, the single crystal growth rate is desired to be in the range of 0.2 mm to 2.5 mm per hour, more preferably, 0.4 mm to 1.6 mm per hour throughout the growth process. High growth rates exceeding 2.5 mm per hour are not adequate because the crystallinity decreases at such a high growth rate, while at low growth rates less than 0.2 mm per hour, productivity is low. In the present invention, it is important to gradually decrease the source material temperature and, as a result, reduce the growth rate gradually.

Figure 2:
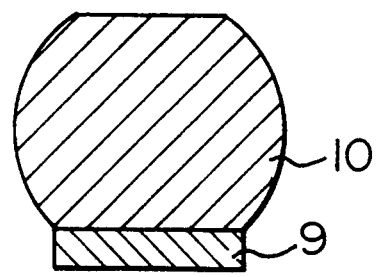
FIG. 2 is a single crystal ingot grown by this method.

FIG. 2 shows a single crystal ingot grown by the method mentioned above. In FIG. 2, the seed crystal is located at the lower position, so that the direction of crystal growth is on the side opposite the seed crystal. The portion of the grown single crystal ingot closer to the seed crystal contains lots of crystal defects and impurities and, therefore, has a poor crystal quality. For blue light emitting diodes and electronic devices, wafers cut from the center region and the top region of the crystal are most suitable because the wafers from those regions are higher in crystal quality.

EMBODIMENT 1

Figure 3:
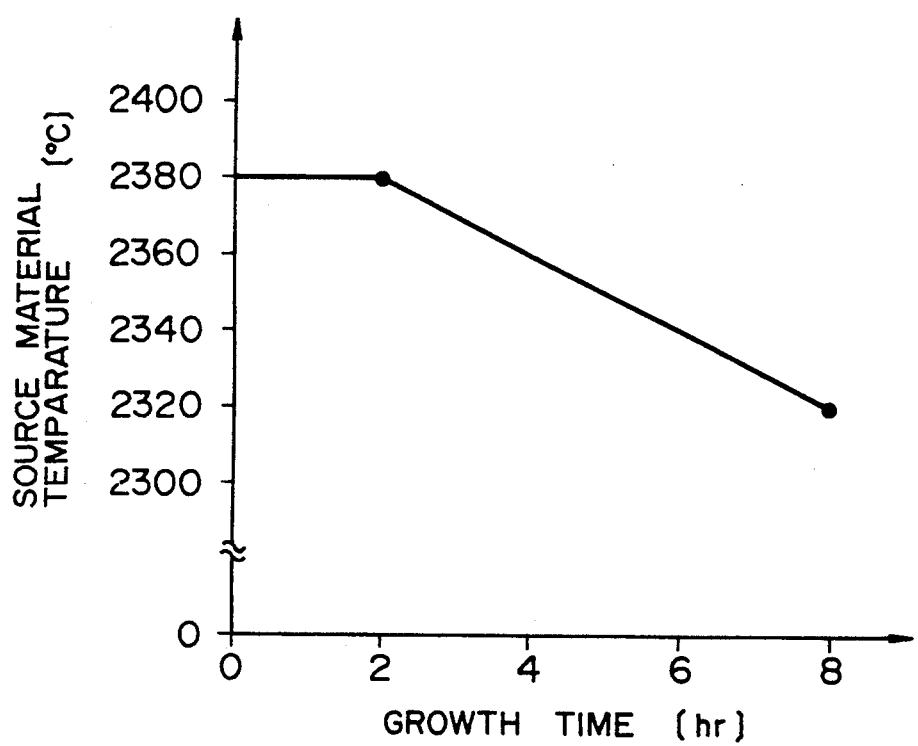
FIG. 3 shows an example of the relation between crystal growth time and source material temperature.

An undoped SiC single crystal was grown using the (000$\bar{1}$)C face of a {0001} wafer of 6H polytype as a seed crystal, and setting the source material temperature at 2380° C. at the start of growth, the seed crystal temperature at 2320° C., and the atmospheric pressure at 20 Torr. FIG. 3 shows the profile of the source material temperature throughout the growth process. As shown in this figure, from the time two hours after the start of the crystal growth process, the source material temperature was decreased at the rate of about 10° C. per hour, and the crystal growth was continued for about eight hours. On the other hand, from the time two hours after the start of the crystal growth process, the seed crystal temperature was lowered at the rate of about 6° C. per hour.

The thus grown crystal had a large (000$\bar{1}$) facet at the top and was excellent in transparency.

Out of {0001} wafers cut from this ingot, wafers from the vicinity of the seed crystal were found to have many black crystal defects. However, the wafers produced from the central and the upper portion end of the ingot did not have black defects as mentioned above. The wafers from the portion near the seed crystal were a little greenish, even though the ingot was formed undoped. This is considered owing to doping with residual nitrogen left in the system. In addition, yellowish parts were observed on the wafers. The difference in color would be due to the kinds of polytypes. The investigation of those portions by Raman scattering clarified that the greenish portion is formed by 6H polytypic crystals, and the yellowish portion by 4H polytypic crystals. On the other hand, the wafers taken from the central portion and the upper portion of the ingot were found to be remarkably transparent and to have only 6H polytype.

EMBODIMENT 2

The crystal growth was performed under the same conditions as in Embodiment 1. It ought to be noted that to investigate the growth rate, marking was done by having nitrogen gas flow at one-hour intervals. Wafers were taken from a grown crystal by vertical slicing along the face including the c axis. The growth rate was estimated according to the occurrence of a green portion formed by doping with nitrogen. In one hour after the start of the crystal growth, the crystal grew about 1.6 mm in the c-axis direction. In contrast, in one hour prior to the end of the crystal growth, the crystal grew no more than about 0.5 mm. From this, it was confirmed that the growth rate decreased gradually.

By using the present invention, it is possible to grow SiC single crystal ingots with a few or without polytypes mixed in and with low levels of crystal defects, along with low levels of impurities, and to supply high-quality single crystal wafers useful in various applications using SiC single crystals, such as blue light emitting diodes and environment-resistant electronic devices.

We claim:

1. A method of growing a first SiC single crystal on a seed crystal including a second SiC single crystal, said method comprising the steps of:
    setting a SiC source material at an initial temperature;
    growing said first SiC single crystal on said seed crystal including said second SiC single crystal at a temperature lower than said initial temperature of said source material; and
    gradually decreasing said source material temperature from said initial temperature during at least a predetermined period during said growing step.

2. A method according to claim 1, wherein said source material temperature is decreased at a rate of 1° C. to 15° C. per hour.

3. A method according to claim 1, wherein said source material temperature is decreased at a rate of 5° C. to 10° C. per hour.

4. A method according to claim 1, wherein said seed crystal temperature is set 30° C. to 120° C. lower than said initial temperature of said source material.

5. A method according to claim 1, wherein said seed crystal temperature is set 50° C. to 80° C. lower than said initial temperature of said source material.

6. A method according to claim 1, wherein said seed crystal temperature remains fixed.

7. A method according to claim 1, further comprising the step of:
    decreasing said seed crystal temperature at a rate lower than that of said source material temperature.

* * * * *